US010705127B2

(12) United States Patent
Barsumian et al.

(10) Patent No.: US 10,705,127 B2
(45) Date of Patent: *Jul. 7, 2020

(54) EXPANDED DETAIL GRAPHICAL DISPLAY FOR SPECTRUM ANALYZERS

(71) Applicant: Research Electronics International, LLC, Cookeville, TN (US)

(72) Inventors: Bruce R. Barsumian, Cookeville, TN (US); Thomas H. Jones, Cookeville, TN (US); Ross Alan Binkley, Cookeville, TN (US)

(73) Assignee: Research Electronics International, LLC, Cookeville, TN (US)

(*) Notice: Subject to any disclaimer, the term of this patent is extended or adjusted under 35 U.S.C. 154(b) by 0 days.

This patent is subject to a terminal disclaimer.

(21) Appl. No.: 16/245,045

(22) Filed: Jan. 10, 2019

(65) Prior Publication Data

US 2019/0162764 A1    May 30, 2019

Related U.S. Application Data

(60) Continuation-in-part of application No. 15/444,293, filed on Feb. 27, 2017, now abandoned, which is a division of application No. 14/677,167, filed on Apr. 2, 2015, now Pat. No. 9,618,549.

(60) Provisional application No. 61/974,190, filed on Apr. 2, 2014.

(51) Int. Cl.
*G01R 23/16*   (2006.01)
*G01R 13/02*   (2006.01)
*G01R 31/302*  (2006.01)
*G01R 31/319*  (2006.01)
*G01R 23/163*  (2006.01)

(52) U.S. Cl.
CPC ........... *G01R 23/16* (2013.01); *G01R 13/02* (2013.01); *G01R 23/163* (2013.01); *G01R 31/3025* (2013.01); *G01R 31/31907* (2013.01)

(58) Field of Classification Search
CPC .. G01R 23/16; G01R 31/31907; G01R 13/02; G01R 31/3025
See application file for complete search history.

(56) References Cited

U.S. PATENT DOCUMENTS

| | | | |
|---|---|---|---|
| 2010/0188406 A1* | 7/2010 | Kincaid | G01R 1/025 345/440 |
| 2013/0100154 A1* | 4/2013 | Woodings | G06T 11/206 345/589 |
| 2014/0194790 A1* | 7/2014 | Crunick | A61H 23/0245 601/21 |

* cited by examiner

*Primary Examiner* — Eugene Yun
(74) *Attorney, Agent, or Firm* — Hornkohl Intellectual Property Law, PLLC; Jason L. Hornkohl

(57) ABSTRACT

A graphical display for displaying spectrum analyzer data that represents detected signal levels for frequencies in an identified frequency span includes a signal level axis that represents a range of detected RF signal levels for the spectrum analyzer data and a frequency axis that represents an identified frequency spectrum span for the spectrum analyzer data. Frequency ranges in the identified frequency span having a high concentration of detected RF energy are automatically graphically expanded and displayed on the frequency axis of the graphical display while frequency ranges having a lower concentration of detected RF energy are simultaneously, automatically graphically condensed and displayed on the first frequency axis of the graphical display.

20 Claims, 13 Drawing Sheets

EXPANDED DETAIL GRAPHICAL DISPLAY FOR SPECTRUM ANALYZERS

CROSS-REFERENCES TO RELATED APPLICATIONS

The present application is a continuation-in-part based on, and claims priority from, co-pending U.S. patent application Ser. No. 15/444,293 filed Feb. 27, 2017 entitled "Improved Data Management with Spectrum Analyzers" which was a divisional application that claimed priority from co-pending U.S. patent application Ser. No. 14/677,167 entitled "Improved Data Management with Spectrum Analyzers" filed Apr. 2, 2015 which claimed priority from Provisional Patent Application No. 61/974,190 entitled "Spectrum Analyzer" filed Apr. 2, 2014, all of which are hereby incorporated by reference.

STATEMENT REGARDING FEDERALLY SPONSORED RESEARCH OR DEVELOPMENT

Not Applicable.

REFERENCE TO SEQUENCE LISTING OR COMPUTER PROGRAM LISTING APPENDIX

Not Applicable.

BACKGROUND

Frequency spectrum analyzers are relatively common products with a broad range of commercial applications. Examples of such applications include, but are not limited to, commercial RF (radio frequency) technologies such, as AM, Cellular, PCS, DCS, 2G, 3G, 4G, LTE, CDMA, cdmaOne, CDMA 2000, W-CDMA/CDMA, 1× EV-DO, DECT phones, GSM, GPRS, EDGE, FM, UMTS, HSDPA, W-CDMA, TDMA, AMPS as well as 802.11, Bluetooth, Broadcast, Emergency, Fire, GPS, HDTV, IBOC, In-Building, Microwave, NPSPAC, Paging, Police, Private radio, Project 25, Public, RADAR, Safety, Telematics, TETRA, Trunking, UMTS, Utilities, WiMAX, Wi-Fi, WLAN and WLL. Spectrum analyzers are used to perform a wide variety of tasks that can occur in connection with these commercial RF applications such as installation, maintenance, troubleshooting, antenna alignment, RF measurements for radio and TV broadcasting, mobile phone base station radiation power density measurements, magnetic interference or leakage from motors and/or miscellaneous machinery, testing of wiring for RF energy, electromagnetic field strength measurement for various EMC limits, and cellular/cordless phone radiation levels.

Additional examples of the commercial use of spectrum analyzers during everyday tasks include searching for unknown RF transmissions, FCC compliance, monitoring blasting sites, identifying RF interference impacting communications systems, security surveys for corporate board rooms, VIP protection, protection of intellectual property, detection and location of magnetic fields, and detection of signal interference and undesired RF emissions from medical equipment.

Universities, community colleges, vocational schools, and high schools also use spectrum analyzers for educational labs and research. There is a similar demand from small start-up companies, hobbyists and individual inventors for a low cost spectrum analyzer that they can use in developing and exploring new product innovations. Spectrum analyzers are also often used in the home to address personal living environment RF safety concerns.

Unfortunately, many currently available spectrum analyzers are overly complicated to use, primarily adapted to sophisticated engineering use and generally ill-suited to perform the more common commercial tasks for which they are commonly used. In particular, many spectrum analyzers utilize graphical displays that make review of spectrum analyzer data cumbersome and difficult to analyze. Therefore, what is needed is an improved method of displaying spectrum analyzer data and an improved graphical display for a spectrum analyzer that is easy to use and adapted to the needs of the commercial user.

BRIEF SUMMARY

The present invention is directed toward improvements in the display of spectrum analyzer data and the operation of commercial spectrum analyzers. More particularly, an embodiment of the present invention is directed toward a method of producing a non-linear frequency axis graphical display for a frequency spectrum analyzer. When using a spectrum analyzer to view a wide frequency span, there is often a very large range of frequencies where few, if any, signals exist. A more useful display provides increased visibility of areas in the frequency spectrum which are populated mere densely with signals, while providing less visibility for areas of the spectrum where fewer signals exist. In accordance with the method, a frequency spectrum trace in a specified frequency span is captured with a spectrum analyzer. An output display is produced having a frequency axis wherein frequency ranges having a high concentration of RF energy are graphically expanded more than frequency ranges having lesser concentrations of RF energy. Hence, when viewing a large portion of the frequency spectrum on a spectrum analyzer, the normal frequency spectrum display is replaced with a non-linear frequency spectrum axis display which provides greater visibility of densely populated areas of the frequency spectrum. When the user zooms in to desired portions of the spectrum, the non-linear display effect can be reduced or completely removed so that the power spectral density of individual signals is not distorted because of the non-linear display effect. This non-linear display effect may be implemented using normal line-type graphing, or, in another embodiment, it may be implemented using a bar graph. In the bar graph embodiment, each bar may represent a different span of frequency spectrum based on the density of the RF energy within that span with the amplitude of the bar representing the total RF energy within that span. In another bar graph embodiment, each bar may represent a different span of frequency spectrum based on the density of the RF energy within that span with the amplitude of the bar representing the peak or average RF power of the RF signals detected within that span.

In one exemplary embodiment, a method of displaying collected spectrum analyzer data begins with the identifying of a frequency spectrum span from the spectrum analyzer data. Frequency ranges in the frequency spectrum span having a high concentration of RF energy are identified and an output graphical display having a first frequency axis wherein the frequency ranges having a high concentration of RF energy are displayed graphically expanded on the first frequency axis while frequency ranges having a lower concentration of RF energy are simultaneously displayed graphically condensed on the first frequency axis is produced. The identified frequency spectrum span is divided into a set of frequency ranges such that each frequency range contains an equal amount of measured RF energy during an initial sampling period or spectrum measurement. A detected signal level in each of the frequency ranges in the set of frequency ranges is represented with a bar corresponding to the frequency range on a bar graph display. A maximum frequency span limit is applied to each of the frequency ranges in the set of frequency ranges such that frequency ranges which would require a frequency span exceeding the maximum frequency span limit in order to have an equal RF energy to the other spans are limited to the maximum frequency range span limit. Frequency ranges below the maximum frequency span limit are expanded such that the identified frequency spectrum span is entirely covered by the set of frequency ranges. Once the frequency ranges corresponding to each bar on the bar graph have been determined, the length of each bar in the bar graph scales linearly with an amount of RF energy measured in the frequency range corresponding to the bar during the most recent spectrum measurement. In an alternative embodiment, the length of each bar in the bar graph scales logarithmically with an amount of RF energy measured in the frequency range corresponding to the bar during the most recent spectrum measurement. In another alternative embodiment, the length of each bar in the bar graph scales linearly or logarithmically with a maximum amount of RF energy measured in any of the individual data points (i.e. frequency bins) within the portion of the spectrum analyzer data within the frequency range corresponding to the bar during the most recent spectrum measurement. In yet another alternative embodiment, the length of each bar in the bar graph scales linearly or logarithmically with a maximum amount of RF energy measured in any RF signal detected within the frequency range corresponding to the bar during the most recent spectrum measurement. In a bar graph embodiment, once the frequency range corresponding to each of the bars has been determined, the frequency range corresponding to each bar remains constant while a length of each bar varies based upon changes in an amount of RF energy measured in the frequency range corresponding to the bar as the spectrum analyzer continues to measure the RF spectrum. Alternatively, the graphical display may comprise a line graph comprising lines connecting spectrum analyzer data points displayed on the graphical display wherein spectrum analyzer data points representing a relatively high measured RF energy are displayed graphically farther apart on the first frequency axis than spectrum analyzer data points representing a lower measured RF energy.

Another exemplary embodiment is directed toward a graphical display for displaying spectrum analyzer data that represents detected signal levels for frequencies in an identified frequency spectrum span. The graphical display comprises a signal level axis that represents a range of detected signal levels for the spectrum analyzer data and a first frequency axis that represents the identified frequency spectrum span for the frequency spectrum analyzer data. Frequency ranges in the identified frequency spectrum span having a high concentration of detected RF energy are automatically graphically expanded and displayed on the first frequency axis of the graphical display while frequency ranges having a lower concentration of detected RF energy are simultaneously, automatically graphically condensed and displayed on the first frequency axis of the graphical display. The graphical display may include a set of bars wherein each bar corresponds to a frequency range in the identified frequency spectrum span. Each bar represents a frequency range in the identified frequency spectrum containing an equal amount of RF energy detected during a sample period. A maximum frequency span limit is applied to each of the bars in the set of bars that would require a frequency range above the frequency span limit in order to have an equal amount of RF energy to bars not subject to the maximum frequency span limit and the frequency range of the bars not subject to the maximum frequency span limit is expanded such that the identified frequency spectrum span is entirely represented by the set of bars. Each bar in the bar graph starts with an initial length that is subsequently altered based on an amount of RF energy measured within the frequency range corresponding to the bar during a subsequent spectrum measurement. The length of each bar in the bar graph scales linearly or logarithmically with the amount of RF energy measured in the frequency range corresponding to the bar.

BRIEF DESCRIPTION OF THE SEVERAL VIEWS OF THIS DRAWINGS

Figure 1:
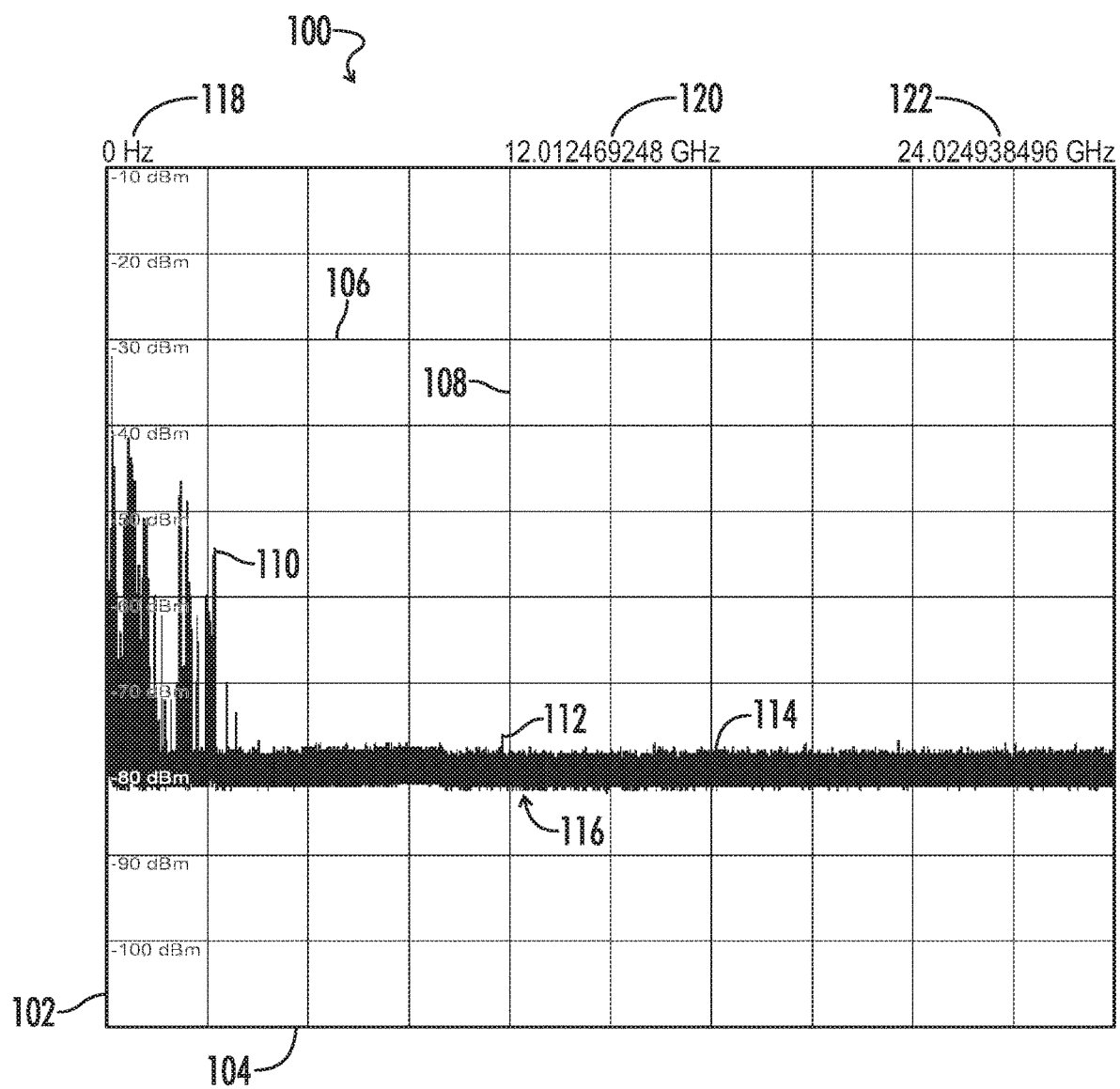
FIG. 1 is a linear frequency axis graphical display displaying spectrum analyzer data being collected by a spectrum analyzer prior to the analyzer entering a non-linear display mode of operation in accordance with an embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

As described herein, various embodiments of the present invention automatically employ novel non-linear graphic techniques when displaying the frequency axis on a spectrum analyzer user interface or other display in order to provide a more user-friendly view of the RF spectrum over a broad range of frequencies. Typically, a spectrum analyzer will scan a wide frequency range that will have very few signals to display for large portions of the spectrum. Embodiments at the present invention may utilize an algorithm to dynamically adjust the displayed frequency axis to graphically expand the frequency axis in areas with higher concentrations of RF energy and to graphically condense the frequency axis for frequency ranges with little or no measurable RF energy. Doing so produces a more readily readable display that is automatically focused on the areas of likely interest.

In an embodiment, the spectrum analyzer data may be initially collected and peaked and a line graph display used to display the spectrum analyzer data. While any suitable arrangement can be utilized, the vertical axis of the line graph preferably represents, measured RF energy and the horizontal axis of the line graph represents frequency. In such an embodiment, data points in regions with higher concentrations of measured RF energy may be displayed farther apart on the frequency axis, while data points in regions with lower concentration of measured RF energy maybe be displayed closer together on the frequency axis.

Referring now to FIG. 1, a linear frequency axis graphical display 100 displaying spectrum analyzer data being collected by a spectrum analyzer prior to the analyzer entering a non-linear display mode of operation in accordance with an embodiment of the present invention is shown. The graphical display 100 displays the signal strength on the vertical axis 102 and the frequency on the horizontal axis 104 for a set of Fourier transformed spectrum analyzer data 116. The vertical lines or divisions 108 on the graphical display 100 divide the horizontal frequency axis 104 into equal sized frequency ranges while the horizontal lines or divisions 300 divide the signal strength axis 102 into equal 10 dBm increments. In the particular embodiment shown, the low 118, mid-range 120 and high 122 frequencies of the scanned frequency range displayed are indicated at the top of the display 100. Peaks 110 and 112 in the transformed spectrum analyzer data 116 displayed on the graphical display 100 indicate relatively high power signals detected in the displayed frequency span. While portions of the displayed frequency range, such as portion 114, represent frequency ranges where no signals above a threshold power level, which may be the background noise level or any other desired threshold level, are present in the transformed spectrum analyzer data 116.

In accordance with an embodiment, once the spectrum analyzer data has been collected and transformed, the frequency spectrum may be expanded or contracted in selected frequency ranges based upon the amount of RF energy detected. As a non-limiting example, the frequency spectrum may be divided into frequency ranges such that each of these frequency ranges includes an equal amount of RF energy measured in the collected spectrum analyzer data. Optionally, a maximum frequency range width may be applied if some portions of the frequency spectrum contain a very low energy concentration relative to others.

Figure 2:
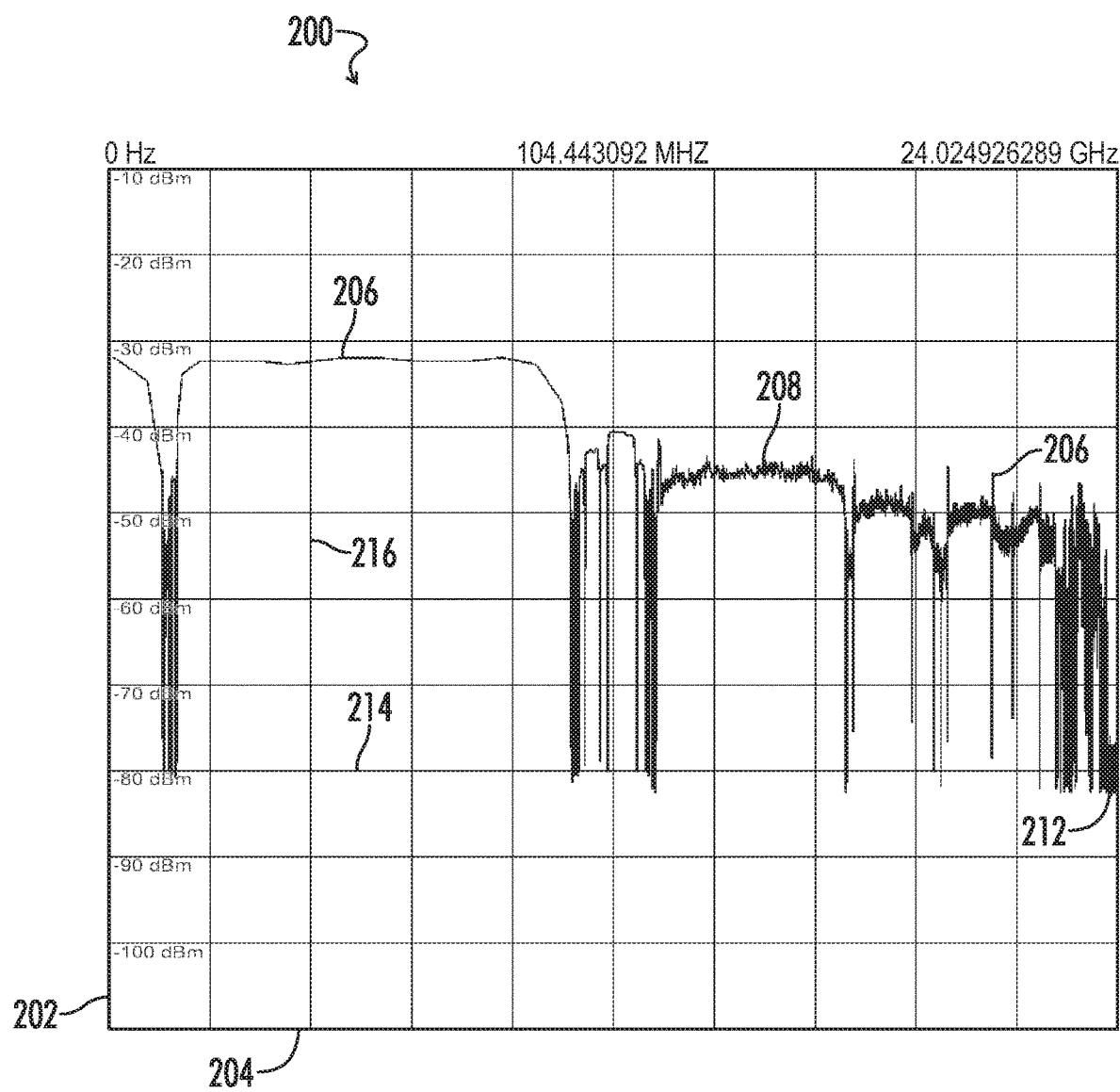
FIG. 2 is an example of a non-linear frequency axis graphic display in accordance with an embodiment.

Referring now to FIG. 2, an example of a non-linear frequency axis graphic display 200 created in accordance with an embodiment is shown. The display 200 of FIG. 2 uses the same spectrum analyzer data points 116 as the display 100 of FIG. 1. However, in the display of FIG. 2, the data points 116 are spaced on the frequency axis 204 in direct proportion to the power level represented by each point. Thus, while the horizontal bars 214 of the graphic display 200 still divide the vertical axis 202 into equal 10 dBm increments, the vertical bars 216 no longer divide the frequency axis into equally sized frequency ranges. Rather, the spacing of the data points along the frequency axis 204 is dependent upon the power level of the signals detected at each frequency. As expected, this graphical scheme dramatically increases the width of higher-power signals 206, 208 and 210 while dramatically decreasing the area representing the noise floor 212.

Figure 3:
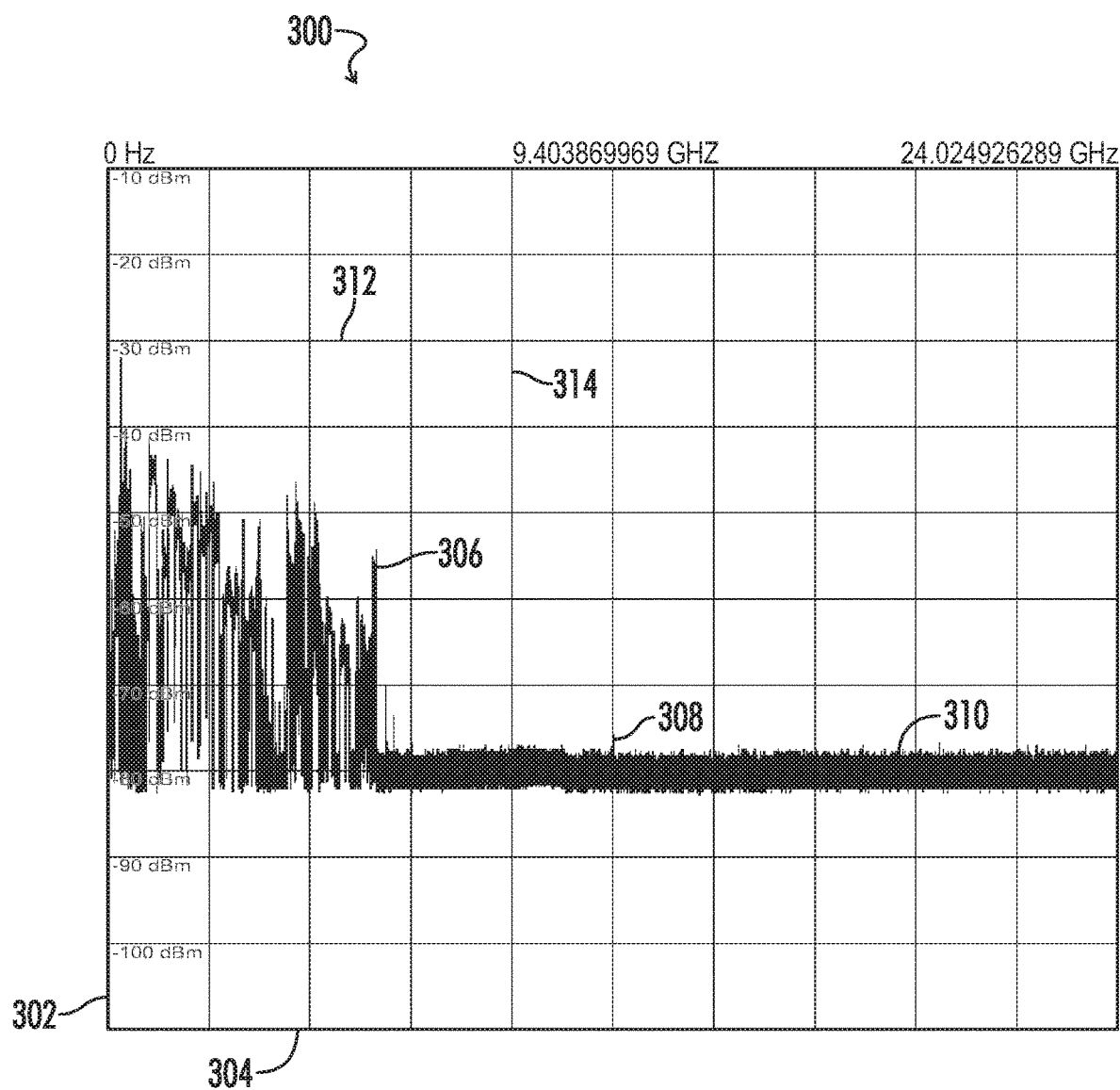
FIG. 3 is an example of a non-linear frequency axis graphic display in accordance with another embodiment.

Referring now to FIG. 3, an example of a non-linear frequency axis graphic display created in accordance with another embodiment is shown. The display 300 again uses the same spectrum analyzer data 118 as the display 100 of FIG. 1. The horizontal bars 312 of the graphic display 300 still divide the vertical axis 302 into equal 10 dBm increments. However, the vertical bars 314 no longer divide the frequency axis 304 into equally sized frequency ranges. Rather, in the graphical display 300 of the embodiment of FIG. 3, the frequency spectrum data points are spaced on the frequency axis 304 according to a logarithmic scaling of the power level represented by each data point. More specifically, points with less than a −80 dBm power level are displayed with the minimum distance between points and other points are displayed with a distance that is the power in dBm+80 times the minimum distance. So, for example, points with a −30 dBm power level are displayed with 50 times mere distance between points than points having, a −80 dBm power level are displayed (as opposed to 100,000 times the distance in the linear example). The result of the logarithmic scaling is that the region 306 with relatively high power level signals has been expanded along the frequency axis 304 while the region with only noise 310 has been contracted, but much less so than with the direct scaling of FIG. 2. Utilizing logarithmic scaling provides additional detail with respect to the detected signals 306 and 308 and more fully and efficiently utilizes the area of the graphic display 300. In such an embodiment as that shown in FIG. 3, the isolated low power narrow range signal 308 remains a noticeable, isolated peak.

Another embodiment of the graphic display is directed toward a method of creating a power vs. frequency bar graph display wherein the frequency axis is dynamically adjusted based on the measured concentration of RF energy. According to this embodiment, the first step of the method is to collect spectrum analyzer data for the frequency spectrum span that should be displayed, such as the example data 420 shown in FIG. 4.

Figure 4:
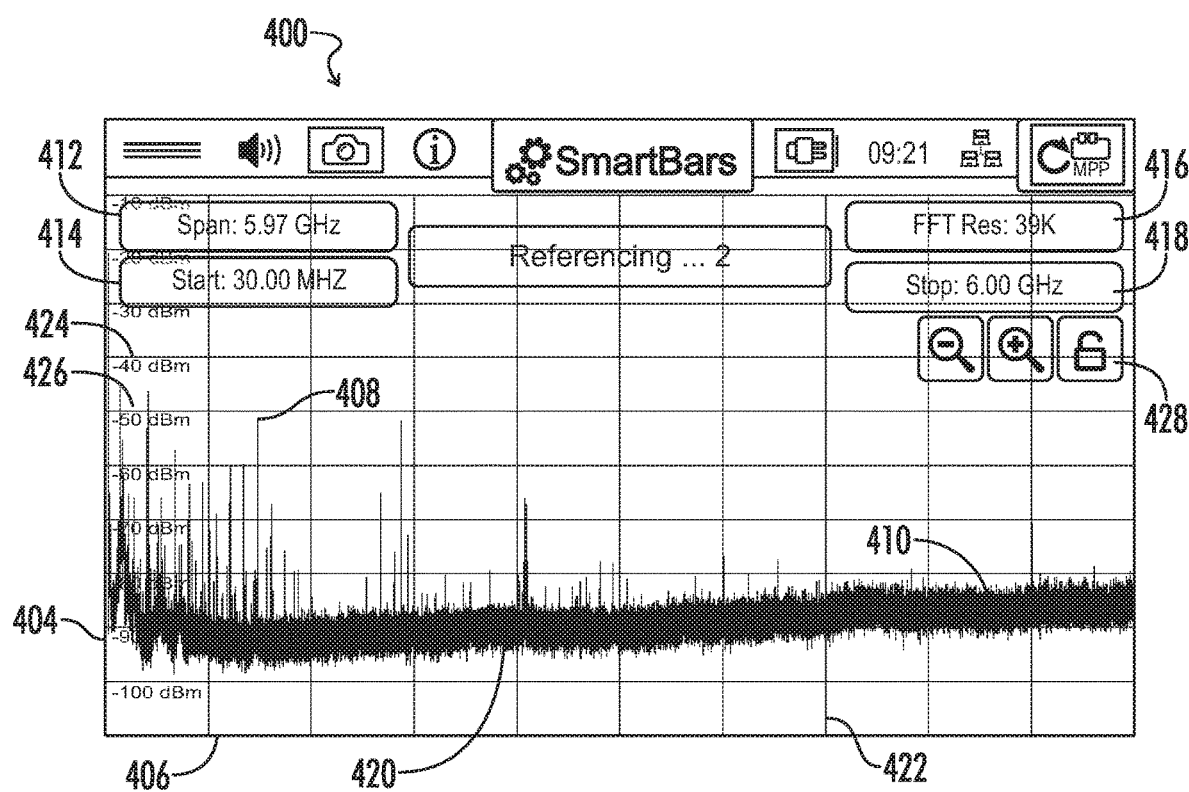
FIG. 4 is a linear frequency axis graphical display displaying spectrum analyzer data being collected by a spectrum analyzer prior to the analyzer entering a non-linear bar graph mode of operation in accordance with another embodiment.

FIG. 4 is a linear frequency axis graphical display 400 displaying spectrum analyzer data being collected by a spectrum analyzer prior to the analyzer entering a bar graph display mode of operation in accordance with an embodiment of the present invention. The graphical display 400 shown displays the signal strength on the vertical axis 404 and the frequency on the horizontal axis 406 for a set of Fourier transformed spectrum analyzer data 420. The vertical lines or divisions 422 on the graphical display 400 divide the horizontal frequency axis 406 in to equal sized frequency ranges while the horizontal lines or divisions 424 divide the signal strength axis 404 into equal 10 dBm increments. Peaks 408 in the transformed spectrum analyzer data 420 displayed on the graphical display 400 indicate relatively high power signals detected in the displayed frequency span. While portions of the displayed frequency range, such as portion 410, represent frequency ranges where no signals above a threshold power level, which may be the background noise level or any other desired level, are present in the transformed spectrum analyzer data 420. In the particular embodiment shown, various parameters such as the frequency span displayed 412, the lowest 414 and highest 418 frequencies displayed on the display 400, and the resolution 416 of the Fast Fourier Transformed data 420 are displayed on the graphical display 400.

During the data gathering step, an embodiment may collect multiple traces of the frequency spectrum and peak them together such that the peaks of each trace are included to form the spectrum analyzer data. Such an embodiment preferably allows the user to choose when a sufficient amount of spectrum analyzer data bias been peaked, such as by using the exemplary button 502 shown in the graphical display 500 of FIG. 5.

Figure 5:
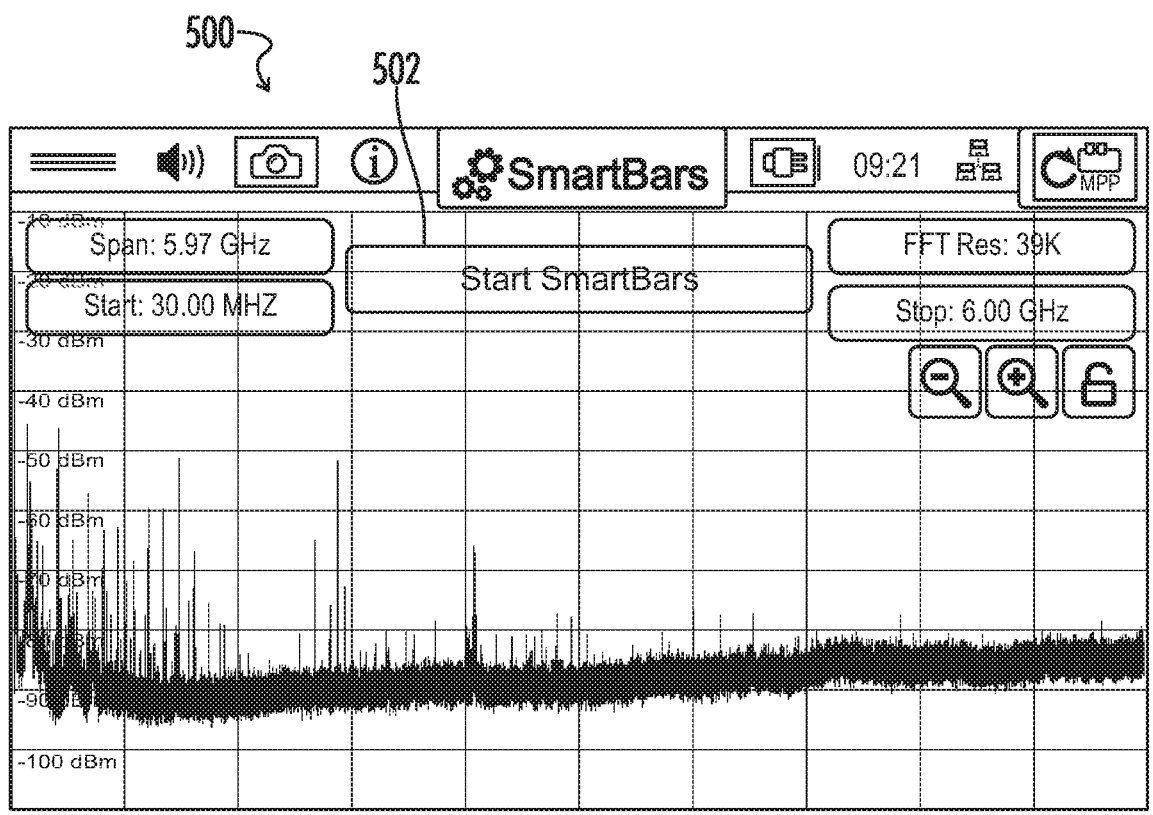
FIG. 5 is an example of a graphic display with a bar graph display selection button in accordance with an embodiment.

FIG. 5 is an example of a graphic display 500 with a bar graph display selection button in accordance with an embodiment utilizing bar graphs. As shown in the figure, a "Start Smart Bars" button 502 is displayed on the display 500 that allows a user to select the bar graph mode. Once the button 502 is selected, the line graph display 500 is changed to the bar graph display 600 of FIG. 6.

Figure 6:
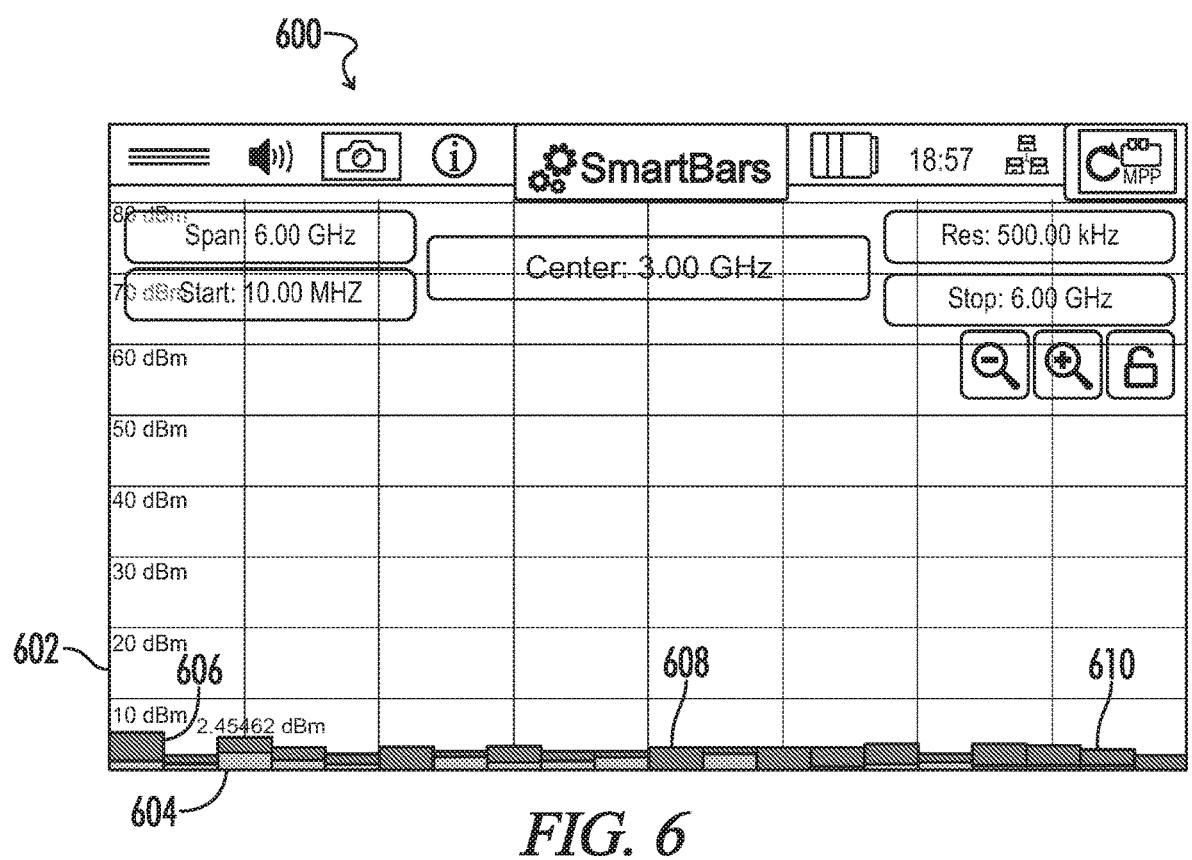
FIG. 6 is a start screen of a bar graph graphic display in accordance with an embodiment.

In accordance with the embodiment of FIG. 6, once the spectrum analyzer data has been collected and transformed, the frequency spectrum may be divided into a plurality of potentially unequal frequency ranges, for example approximately 20, based upon the amount of RF energy detected. For example, the frequency spectrum may be divided into frequency ranges such that each of these ranges includes an equal amount of RF energy measured in the collected spectrum analyzer data. Optionally, a maximum frequency range width may be applied if some portions of the spectrum contain very low energy concentration relative to others.

Once these frequency ranges have been identified, the embodiment of the graphic display 600 displays a power 602 vs. frequency 604 bar graph with each of the identified frequency ranges assigned to one bar, such as bars 606, 608 and 610, on the graphical display 600. Since each bar 606, 608 or 610 preferably represents an equal amount of RF energy detected in the represented frequency range during an initial scan or sampling period, bars representing portions of the spectrum with higher RF energy concentration 606 will represent a more narrow range of frequencies, while bars representing portions of the spectrum with lower RF energy concentration 610 will represent a broader range of frequencies. The length of each bar in the bar graph may scale linearly with the maximum amount of RF energy measured in any RF signal subsequently detected within the frequency span corresponding to the bar or scale logarithmically, with the maximum amount of RF energy measured in any RF signal detected within the frequency span corresponding to the bar. Alternatively, the length of each bar in the bar graph may be scaled linearly or logarithmically with respect to the total RF energy measured in the frequency range corresponding to the bar in a subsequent spectrum measurement. As yet another alternative, the length of each bar in the bar graph may be scaled linearly or logarithmically with the maximum RF energy measured in a frequency bin (i.e. data point) in the portion of the spectrum analyzer data that lies within the frequency range corresponding to the bar.

For example, region 426 in FIG. 4, having a high concentration of RF energy, is represented by bar 606 in FIG. 6, which represents a relatively narrow range of frequencies, as shown by display 400. Meanwhile, example region 410 in FIG. 4, having a relatively low concentration of RF energy, is represented by bar 610 in FIG. 6, which represents a relatively broad range of frequencies, as also shown in FIG. 4 and discussed in more detail below.

In the embodiment of FIG. 6, once frequency ranges corresponding to the bars have been determined, the frequency ranges corresponding to each bar remain constant while the lengths of the bars continue to change according to the RF energy measurements in newly-collected spectrum analyzer data. Each bar is divided to present two different pieces of information, the current RF signal strength detected in the displayed frequency range and the maximum RF signal strength energy in any measurement in that bar's frequency range since the bar graph display was first displayed. The display 600 starts with each bar representing an equal detected signal strength but an unequal frequency range. As time proceeds, the spectrum analyzer continues collecting data and the height of each bar will represent the maximum amount of RF energy measured within the frequency range represented by that bar.

Figure 7:
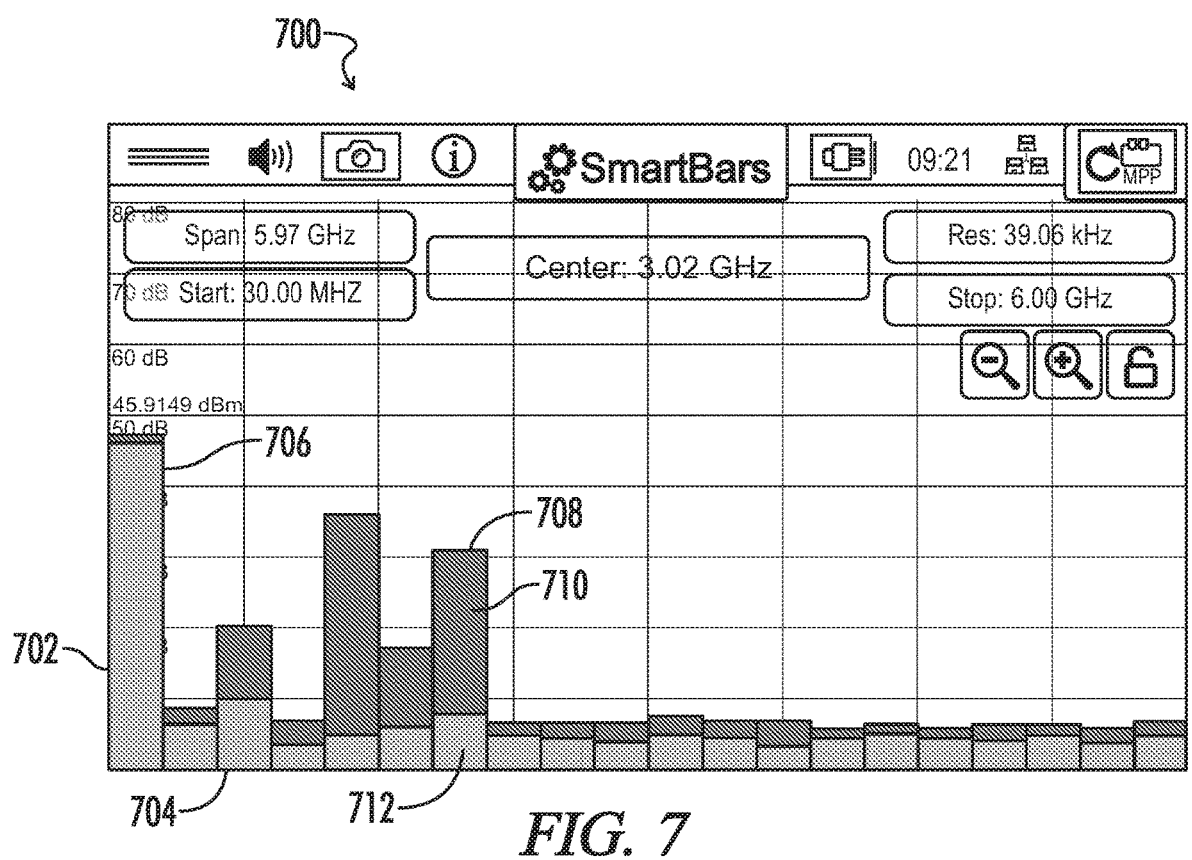
FIG. 7 is a non-linear bar graph display created in accordance with an embodiment wherein the non-linear bar graph display is indicating the presence of a strong RF signal in the frequency range corresponding to the first bar.
Figure 8:
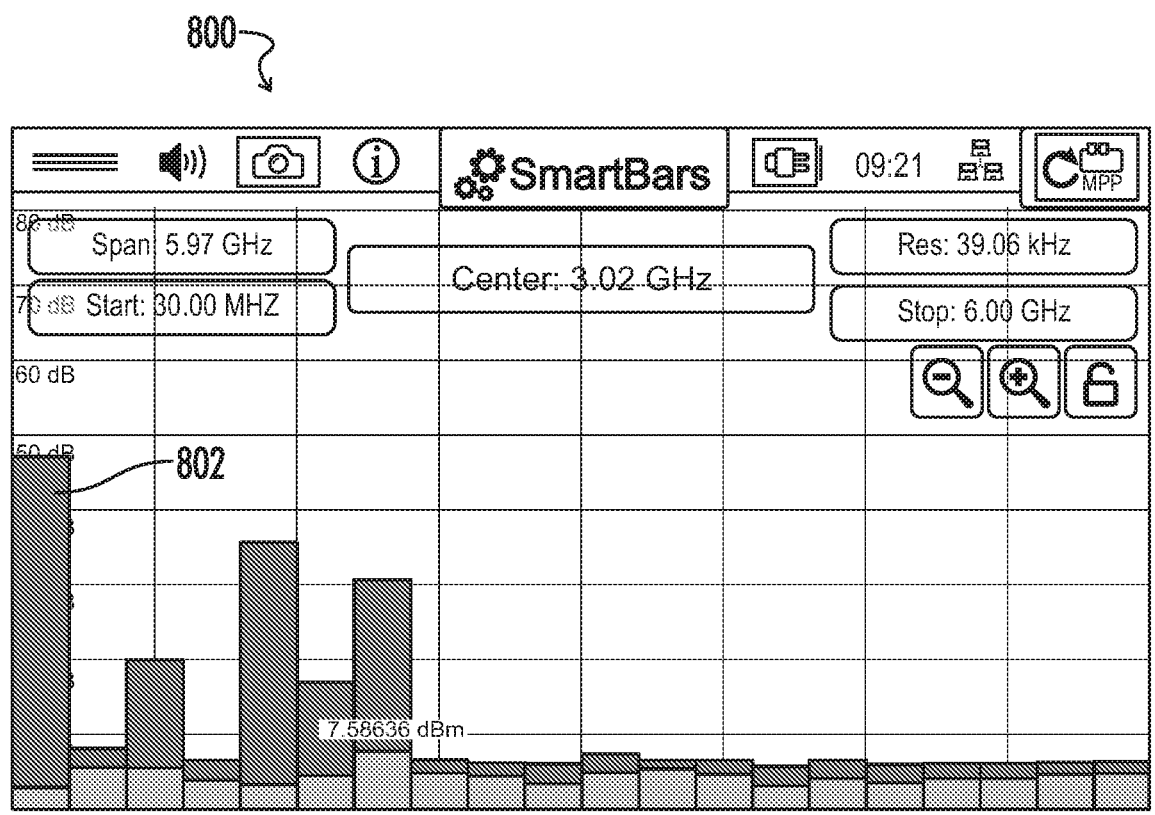
FIG. 8 is an example of a non-linear bar graph display created in accordance with an embodiment wherein the non-linear bar graph display is indicating that a strong RF signal has been detected in the frequency range corresponding to the first bar since the display was opened, but the strong RF signal is no longer being detected.

FIG. 7 is a non-linear bar graph display 700 created in accordance with an embodiment wherein the non-linear bar graph display is indicating the presence of a strong RF signal. As discussed above with respect to FIG. 6, each bar on the horizontal axis 704 represents an unequal frequency range with an approximately equal amount of measured RF energy during an initial sampling period or spectrum measurement. In the embodiment of FIG. 7, each bar is displayed with two colors, one color on the top portion 710 of the bar and another color on the lower portion 712 of the bar as shown in FIG. 7. The full height of the bar 708 on the vertical axis 702 represents the maximum amount of RF energy in any measurement in that bar's frequency range since the bar graph display 700 was first displayed, while the height of the lower portion 712 of the bar in the second color represents the amount of RF energy measured in that bar's frequency range in the most recent measurement. As an example, bar 706 of FIG. 7 indicates that the power of the current signals being detected within the range represented by bar 706 is almost as high as the maximum power level detected during the sample period. As a further example, FIG. 8 is a non-linear bar graph display created in accordance with an embodiment wherein the non-linear bar graph display 800 is indicating that a strong RF signal has been detected in the frequency range corresponding to bar 802 since the display opened, but the strong RF signal is no longer currently being detected.

Figure 9:
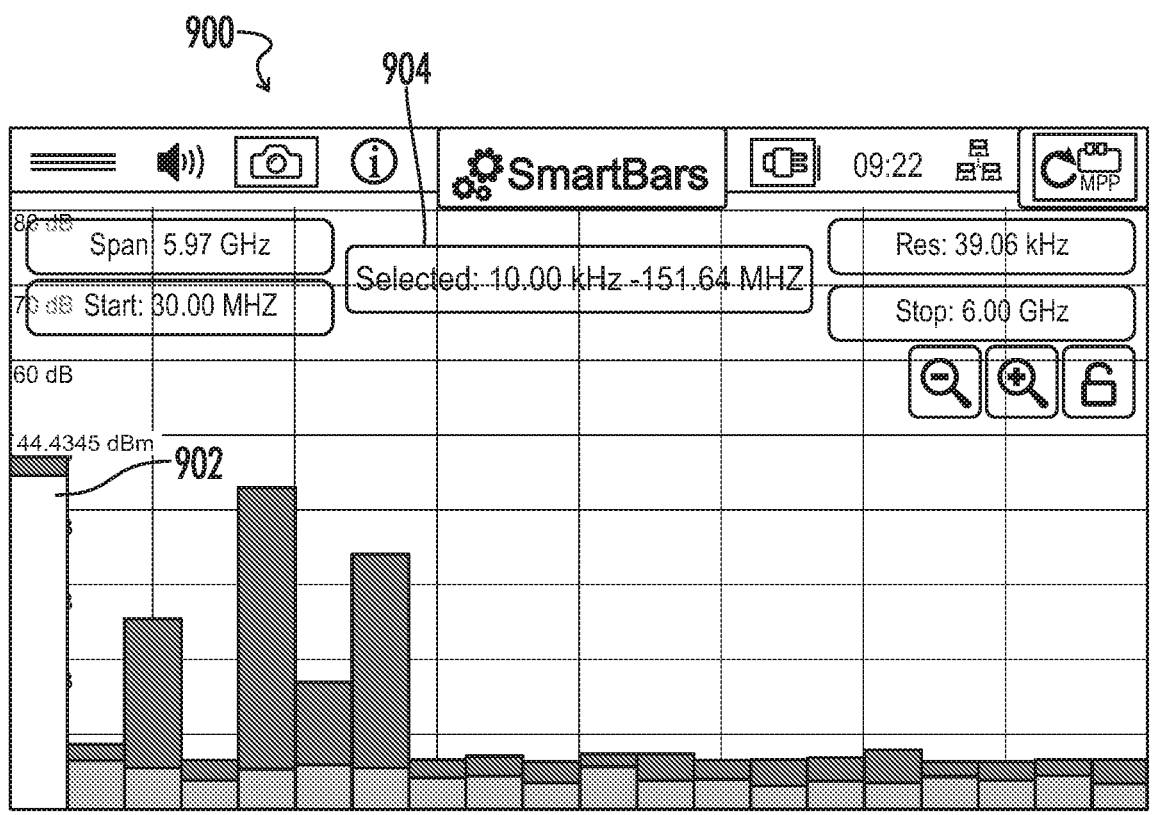
FIG. 9 is an example of a non-linear bar graph display created in accordance with an embodiment of the present invention wherein a bar representing a frequency range that has been graphically expanded due to its high concentration of RF energy has been selected.
Figure 10:
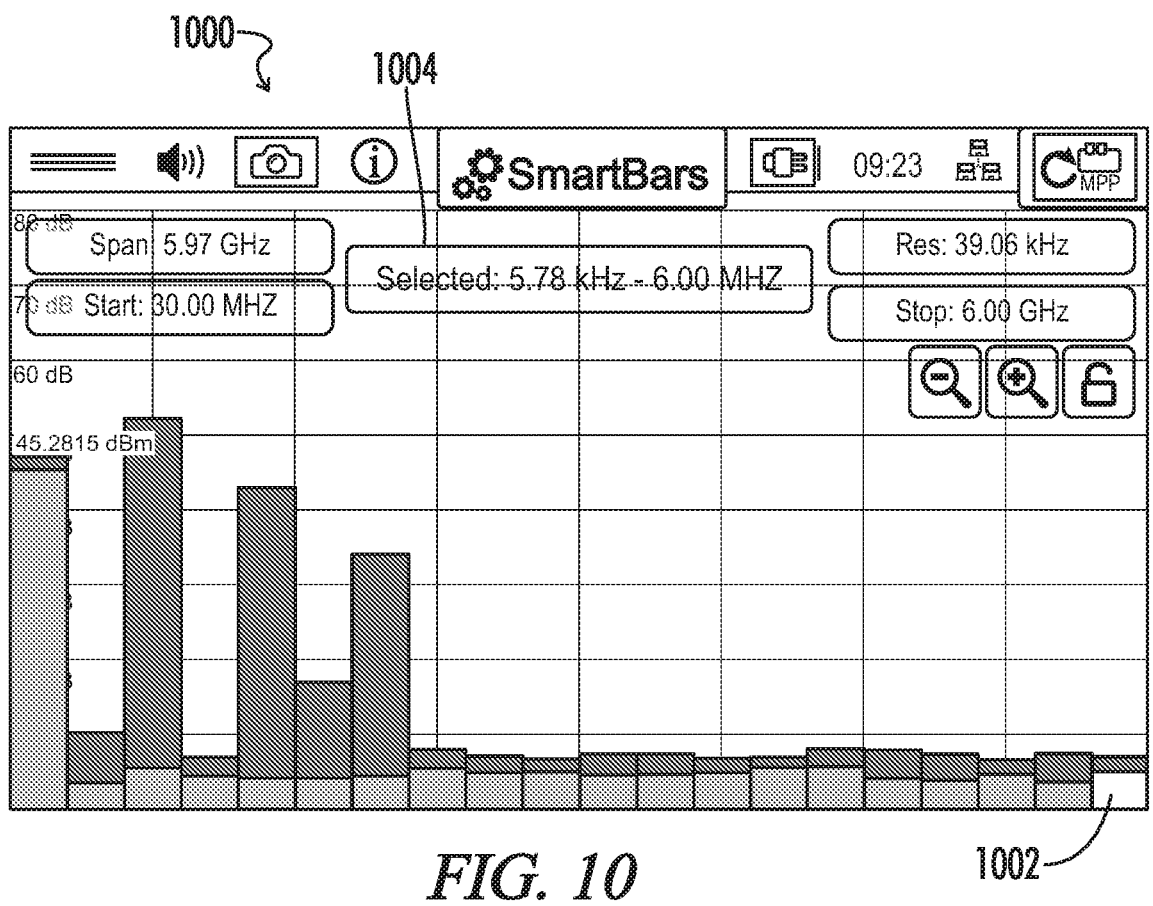
FIG. 10 is an example of a non-linear bar graph display created in accordance with an embodiment wherein a bar representing a frequency range that has been graphically contracted due to its low concentration of RF energy has been selected.

In an embodiment, the bar graph display allows its user to select a particular bar, in which case a third color may be used to indicate that a bar is the currently-selected bar. Referring now to FIG. 9, bar 902 of graphical display 900 is shown selected. When bar 902 is selected, the frequency range 904 for the bar 902 is displayed on the graphic display 900. As shown in the display 1000 of FIG. 10, when bar 1002 is selected, the frequency range 1004 for the bar 1002 or is then displayed on the graphic display 1000. As discussed herein and displayed on the graphic display 1000, the frequency range 1004 for bar 1002 is greater than that of bar 902 of FIG. 9 due to the higher concentration of signals in the frequency range 904 of bar 902.

Figure 11:
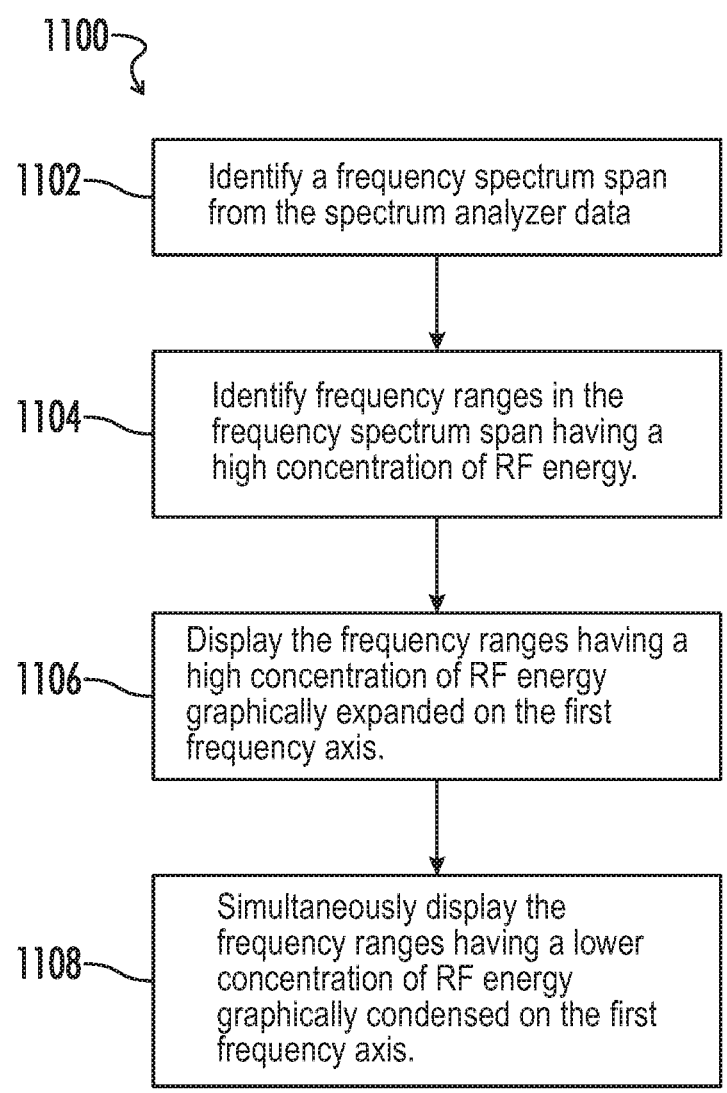
FIG. 11 is a flowchart of a method of displaying collected spectrum analyzer data to produce a graphical display for a spectrum analyzer in accordance with an embodiment.

Referring now to FIG. 11, a flowchart of a method 1100 of displaying collected spectrum analyzer data to produce graphical displays for a spectrum analyzer in accordance with an embodiment is shown. The method begins in step 1102 with the identifying of a frequency spectrum span from the spectrum analyzer data. In step 1104, frequency ranges in the frequency spectrum span having a high concentration of RF energy are identified. The frequency ranges having a high concentration of RF energy are graphically expanded on the first frequency axis in step 1106 and the frequency ranges having a lower concentration of RF energy graphically condensed and simultaneously displayed on the first frequency axis in step 1108.

Figure 12:
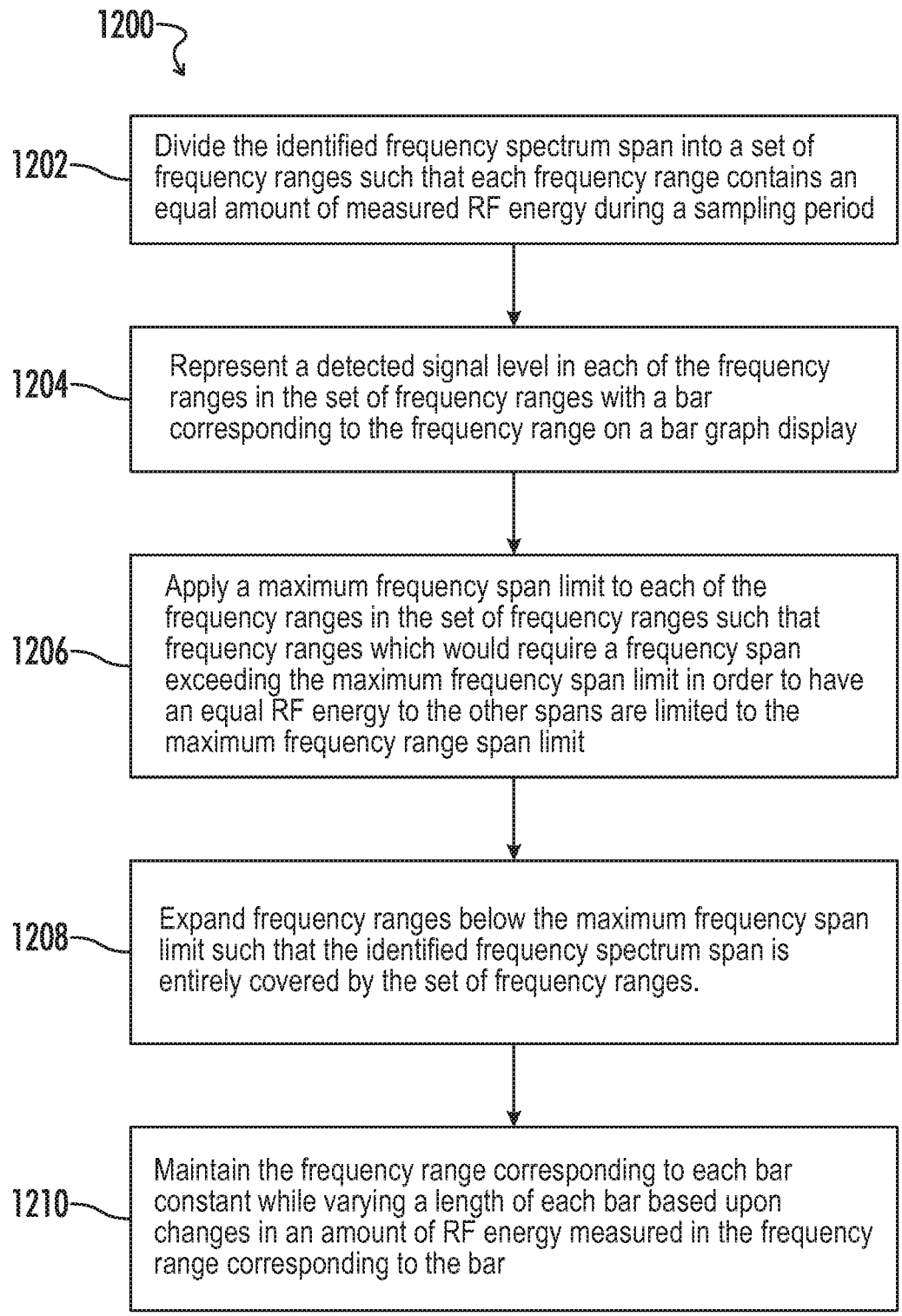
FIG. 12 is a flowchart of a method of creating a bar graph for a graphical display of a spectrum analyzer in accordance with an embodiment.

FIG. 12 is a flowchart of a method 1200 of creating a bar graph for a graphical display of a spectrum analyzer in accordance with an embodiment. The method 1200 begins in step 1202 wherein the identified frequency spectrum span is divided into a set of frequency ranges such that each frequency range contains an equal amount of measured RF energy during a sampling period. The method then proceeds to step 1204 wherein a detected signal level in each of the frequency ranges in the set of frequency ranges is represented with a bar corresponding to the frequency range on a bar graph display. Next, in step 1206, a maximum frequency span limit is applied to each of the frequency ranges in the set of frequency ranges such that frequency ranges which would require a frequency span exceeding the maximum frequency span limit in order to have an equal RF energy to the other spans are limited to the maximum frequency range span limit. In step 1208, frequency ranges below the maximum frequency span limit are expanded such that the identified frequency spectrum span is entirely covered by the set of frequency ranges. The method 1200 ends in step 1210 wherein the frequency range corresponding to each bar is maintained constant while a length of each bar is varied based upon changes in an amount of RF energy measured in the frequency range corresponding to the bar.

Figure 13:
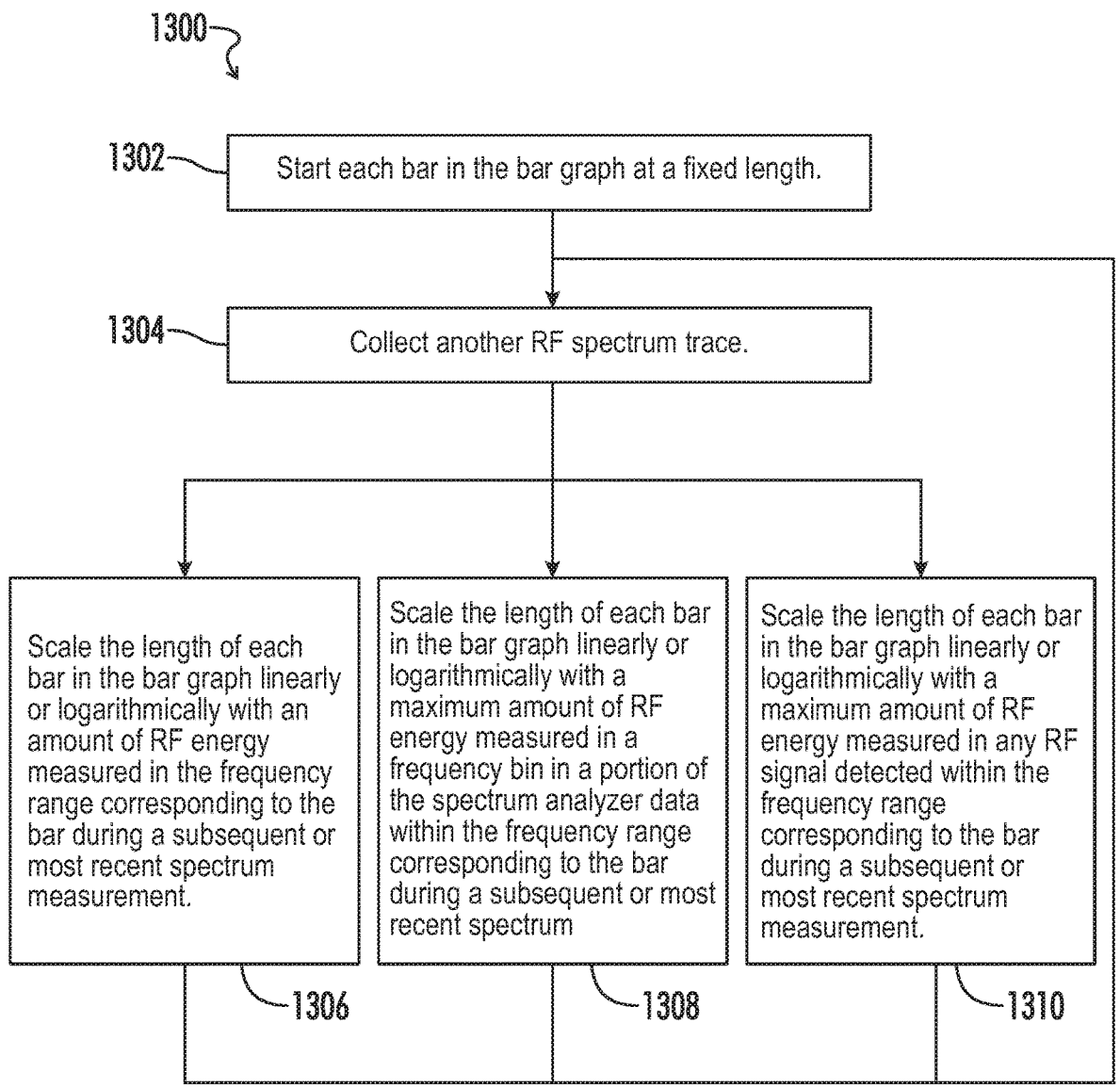
FIG. 13 is a flowchart of a method of determining bar lengths for a bar graph for a graphical display of a spectrum analyzer in accordance with an embodiment.

FIG. 13 is a flowchart of a method 1300 of determining bar lengths for a bar graph for a graphical display of a spectrum analyzer in accordance with an embodiment. The method 1300 begins in step 1302 by starting each bar in the bar graph at a fixed length. The method then proceeds to step 1304 wherein another frequency spectrum trace is collected during a subsequent spectrum measurement. The method then proceeds to either step 1306, 1308 or 1310 wherein the length of bars in the graphs is determined. In step 1306, the length of each bar in the bar graph is scaled linearly or logarithmically with an amount of RF energy measured in the frequency range corresponding to the bar during the subsequent or most recent spectrum measurement. In step 1308, the length of each bar in the bar graph is scaled linearly or logarithmically with a maximum amount of RF energy measured in a frequency bin in a portion of the spectrum analyzer data within the frequency range corresponding to the bar during the subsequent or most recent spectrum measurement. In step 1310, the length of each bar in the bar graph is scaled linearly or logarithmically with a maximum amount of RF energy measured in any RF signal detected, within the frequency range corresponding to the bar during the subsequent spectrum measurement. Once step 1306, 1308, or 1310 has been completed, the method proceeds back to step 1304 wherein a new spectrum measurement is collected and the method repeats.

Although there have been described particular embodiments of the present invention of Expanded Detail Graphical Display for Spectrum Analyzers, it is not intended that such references be construed as limitations upon the scope of this invention except as set forth in the following claims.

What is claimed is:

1. A method of displaying collected spectrum analyzer data, said method comprising:
   identifying a frequency spectrum span from the spectrum analyzer data;
   identifying frequency ranges in the frequency spectrum span having a high concentration of RF energy; and
   producing an output graphical display having a first frequency axis wherein the frequency ranges having a high concentration of RF energy are automatically displayed graphically expanded on the first frequency axis while frequency ranges having a lower concentration of RF energy are simultaneously automatically displayed graphically condensed on the first frequency axis.

2. The method of claim 1 wherein producing an output graphical display further comprises:
   dividing the identified frequency spectrum span into a set of frequency ranges such that each frequency range contained an equal amount of measured RF energy during a sampling period; and
   representing a detected signal level in each of the frequency ranges in the set of frequency ranges with a bar corresponding to the frequency range on a bar graph display.

3. The method of claim 2 further comprising applying a maximum frequency span limit to each of the frequency ranges in the set of frequency ranges such that frequency ranges which would require a frequency span exceeding the maximum frequency span limit in order to have an equal RF energy to the other spans are limited to the maximum frequency range span limit.

4. The method of claim 3 further comprising expanding frequency ranges below the maximum frequency span limit such that the identified frequency spectrum span is entirely covered by the set of frequency ranges.

5. The method of claim 2 wherein each bar in the bar graph starts at a fixed length that varies with changes in an amount of RF energy measured within the frequency range corresponding to the bar during a subsequent spectrum measurement.

6. The method of claim 5 wherein the length of each bar in the bar graph scales linearly with an amount of RF energy measured in the frequency range corresponding to the bar during the subsequent spectrum measurement.

7. The method of claim 5 wherein the length of each bar in the bar graph scales logarithmically with an amount of RF energy measured in the frequency range corresponding to the bar during the subsequent spectrum measurement.

8. The method of claim 5 wherein the length of each bar in the bar graph scales linearly with a maximum amount of RF energy measured in a frequency bin in a portion of the spectrum analyzer data within the frequency range corresponding to the bar during the subsequent spectrum measurement.

9. The method of claim 5 wherein the length of each bar in the bar graph scales logarithmically with a maximum amount of RF energy measured in a frequency bin in a portion of the spectrum analyzer data within the frequency range corresponding to the bar during the subsequent spectrum measurement.

10. The method of claim 5 wherein the length of each bar in the bar graph scales linearly with a maximum amount of RF energy measured in any RF signal detected within the frequency range corresponding to the bar during the subsequent spectrum measurement.

11. The method of claim 5 wherein the length of each bar in the bar graph scales logarithmically with a maximum amount of RF energy measured in any RF signal detected within the frequency span corresponding to the bar during the subsequent spectrum measurement.

12. The method of claim 2 wherein, once the frequency range corresponding to each of the bars has been determined, the frequency range corresponding to each bar remains constant while a length of each bar varies based upon changes in an amount of RF energy measured in the frequency range corresponding to the bar during a subsequent spectrum measurement.

13. The method of claim 1 wherein the graphical display further comprises a line graph comprising lines connecting spectrum analyzer data points displayed on the graphical display.

14. The method of claim 13 wherein spectrum analyzer data points representing a relatively high measured RF energy are displayed graphically farther apart on the first frequency axis than spectrum analyzer data points representing a lower measured RF energy.

15. A graphical display for displaying spectrum analyzer data that represents detected signal levels for frequencies in an identified frequency spectrum span, said graphical display comprising:
   a signal level axis that represents a range of detected signal levels for the spectrum analyzer data; and
   a first frequency axis that represents the identified frequency spectrum span for the frequency spectrum analyzer data;
   wherein frequency ranges in the identified frequency spectrum span having a high concentration of detected RF energy are automatically graphically expanded and displayed on the first frequency axis of the graphical display while frequency ranges having a lower concentration of detected RF energy are simultaneously, automatically graphically condensed and displayed on the first frequency axis of the graphical display.

16. The graphical display of claim 15 wherein the graphical display further comprises a set of bars wherein each bar corresponds to a frequency range in the identified frequency spectrum span.

17. The graphical display of claim 16 wherein each bar represents a frequency range in the identified frequency spectrum containing an equal amount of RF energy detected during a sample period.

18. The graphical display of claim 17 wherein a maximum frequency span limit is applied to each of the bars in the set of bars that would require a frequency range above the frequency span limit in order to have an equal amount of RF energy to bars not subject to the maximum frequency span limit and the frequency range of the bars not subject to the maximum frequency span limit is expanded such that the identified frequency spectrum span is entirely represented by the set of bars.

19. The graphical display of claim 16 wherein each bar in the bar graph starts with an initial length that is subsequently altered based on an amount of RF energy measured within the frequency range corresponding to the bar during a subsequent spectrum measurement.

20. The graphical display of claim 19 wherein the length of each bar in the bar graph scales one of linearly and logarithmically with the amount of RF energy measured in the frequency range corresponding to the bar during the subsequent spectrum measurement.

* * * * *